US006925028B2

(12) United States Patent
Hosokawa et al.

(10) Patent No.: US 6,925,028 B2
(45) Date of Patent: Aug. 2, 2005

(54) DRAM WITH MULTIPLE VIRTUAL BANK ARCHITECTURE FOR RANDOM ROW ACCESS

(75) Inventors: Kohji Hosokawa, Ohtsu (JP); Toshio Sunaga, Ohtsu (JP); Shinpei Watanabe, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/473,632

(22) PCT Filed: Mar. 6, 2002

(86) PCT No.: PCT/JP02/02093

§ 371 (c)(1),
(2), (4) Date: Oct. 1, 2003

(87) PCT Pub. No.: WO02/080180

PCT Pub. Date: Oct. 10, 2002

(65) Prior Publication Data

US 2004/0190362 A1 Sep. 30, 2004

(30) Foreign Application Priority Data

Mar. 29, 2001 (JP) ........................................ 2001-095368

(51) Int. Cl.[7] ................................................ G11C 8/00
(52) U.S. Cl. ............................ 365/230.03; 365/230.08; 365/230.06
(58) Field of Search ..................... 365/230.03, 230.08, 365/230.06, 189.05, 295

(56) References Cited

U.S. PATENT DOCUMENTS

| 5,073,873 | A | | 12/1991 | Nogami |
| 5,416,748 | A | | 5/1995 | Fujita |
| 5,691,949 | A | * | 11/1997 | Hively et al. ........... 365/230.03 |
| 5,970,019 | A | | 10/1999 | Suzuki |

FOREIGN PATENT DOCUMENTS

| EP | 370460 A2 | 11/1989 |
| JP | 2-141993 | 5/1990 |
| JP | 6-119781 A | 4/1994 |
| JP | 11-25669 A | 1/1999 |
| KR | 600184 A2 | 5/1993 |

* cited by examiner

Primary Examiner—David Lam
(74) Attorney, Agent, or Firm—Michael J. LeStrange

(57) ABSTRACT

A DRAM and access method for DRAM with a high data rate in a random row access mode. The DRAM includes a plurality of memory blocks composed of a plurality of storage segments each with a series of main word lines and sub-word lines. Each memory block is decoded into multiple segments and the main word lines are activated to select a predetermined number of sub-word lines. A corner block is provided that contains a plurality of Z-lines for selecting one of the sub-wordlines and a plurality of segment select lines for selecting a specific memory segment by activating a local Z-line.

7 Claims, 3 Drawing Sheets

DRAM WITH MULTIPLE VIRTUAL BANK ARCHITECTURE FOR RANDOM ROW ACCESS

BACKGROUND OF INVENTION

1. Field of the Invention

The present invention relates to a DRAM (Dynamic Random Access Memory) and access method thereof, and more particularly to a DRAM incorporating an access method for achieving a high data rate in random row access.

2. Background of the Invention

The relatively slower speed of DRAM arrays as compared to the processor represents the major performance limiting factor in microprocessor based systems. Particularly in the case of random row access where the row address changes continuously. The operational latency associated with random row access and the additional delay introduced with precharge for the previous access cause the performance of DRAM to lag behind the processor. In order to mitigate the degraded performance associated with random row access as much as possible, recent high-performance DRAM's such as SDRAM (synchronous DRAM), SDRAM DDR (SDRAM Double Data Rate), Rambus, etc., employ multiple bank array topology. Furthermore, for speeding up DRAM, every effort is made to incorporate a system program or memory mapping scheme such that a column address in the same page can be accessed.

However, this is not possible between individual programs and consequently an access to another row address is bound to occur. Given that the banks are provided, an access to the next row address selected can occur without precharging the row currently accessed if the next row address is in a different bank than the one currently accessed. Therefore, the next burst takes place just when the previous burst ends, which allows the fast processing without temporal empty periods on the data bus.

In order to migrate from one bank to another without bank conflicts, it is necessary to increase the number of banks considerably. An active, precharge as well as read and write signals and control for these signals for each bank are required. Since provision of a number of banks brings an increase of chip size, realistically only four banks are usually able to be provided for SDRAM.

For example, the Rambus DRAM, provides 16 banks of 72 Mb each or 32 banks of 144 Mb each with a correspondingly large penalty in chip area. The cycle time is considerably longer for this configuration and three banks are occupied for one row access because banks are configured across shared sense amplifiers. Thus, there will be a small gain in performance even if the number of banks is increased to 32 while consuming still more chip area. The limitations of the Rambus implementation, which are not atypical, suggest that a high data rate for random row access is not possible.

As shown in FIG. 1, a conventional SDRAM 40 has four banks of 32 Mb each, which are independent blocks. One row access activates 8-K sense amplifiers. One bit line is traversed by 512 word lines orthogonally. Therefore, this means that a block comprised of a cell array of 4 Mb (=512×8 K) is activated. Namely, a 32 Mb bank is comprised of 8 blocks. According to the design, other row addresses in the same bank can not be accessed.

Practically speaking, row addresses that can not be accessed without incurring additional delay comprise the 511 other word lines in the same 4 Mb bank. The word lines of the other seven blocks that do not share sense amplifiers are realistically accessible even in the same bank. Nevertheless, the reason for not designating this block unit as a discrete bank is because chip size increases significantly with the number of banks. This is primarily due to the added complexity associated with additional control logic and signal lines as the number of banks increases. Since 16 data lines from each bank are connected to 16 data I/O pads, the number of wire connections to I/O pads increases when the number of banks increases.

A Rambus DRAM architecture 42, is illustrated in FIG. 2, where banks are composed as a 4 Mb block surrounded by 512 word lines sharing sense amplifiers, wherein 32 banks are provided in a whole chip, which is more than a typical SDRAM design. In order to avoid wiring congestion, the Rambus array 42 is configured as a vertical stack structure as shown in FIG. 2. However, the increase of chip size is inevitable due to a large number of control signals to each bank. Furthermore, since the length of pages becomes shorter and the probability of page misses increases when increasing the number of banks, it is necessary to increase the number of banks to be activated.

Since the number of banks that can be used for a new row access decreases, resulting in the increase of probability of bank conflicts, the purpose of increasing the number of banks, that is, decreasing the number of bank conflicts, is defeated. Therefore, though the probability of bank conflicts is reduced by increasing the number of banks while maintaining most banks not activated, the page hit rate may actually decrease. In this regard, the expectation of a high hit rate in page mode while attempting to avoid bank conflicts is not realistic, thus the performance is not enhanced very much regardless of the number of banks. As a result, it is essentially impossible to solve the dual problems of page misses and bank conflicts simply by increasing the number of banks.

It is therefore an object of the present invention to provide a DRAM and access method for DRAM with a high data rate in a random row access.

SUMMARY OF INVENTION

In the present invention, there is provided a DRAM comprising: a block composed of a plurality of segments storing data; main word lines for selecting a predetermined number of sub-word lines from a plurality of sub-word lines, and corner blocks for selecting one of the plurality of segments and one of the predetermined number of sub-word lines, wherein the corner block comprises: a plurality of global Z-lines to which a signal is sent for selecting the one of the predetermined number of sub-word lines; segment select lines to which a signal is sent for selecting the segment; a plurality of NAND circuits to which the sub-word lines and segment select lines are connected; a plurality of latch circuits operated by predetermined signals from the NAND circuits.

A method for accessing a DRAM where one block is divided into multiple segments by a segment decoder and a desired sub-word line is selected from a plurality of sub-word lines in the block, the method comprising the steps of: activating main word lines to select a predetermined number of sub-word lines from the plurality of sub-word lines; activating a desired global Z-line among a plurality of global Z-lines contained in a corner block and segment select lines to activate a local Z-line corresponding to the desired global Z-line among the plurality of local Z-lines; and selecting a sub-word line corresponding to the activated local Z-line from the predetermined number of sub-word lines.

DETAILED DESCRIPTION

Now the DRAM structure and access method of the present invention will be described with reference to FIG. 3 and FIG. 4.

Figure 1:
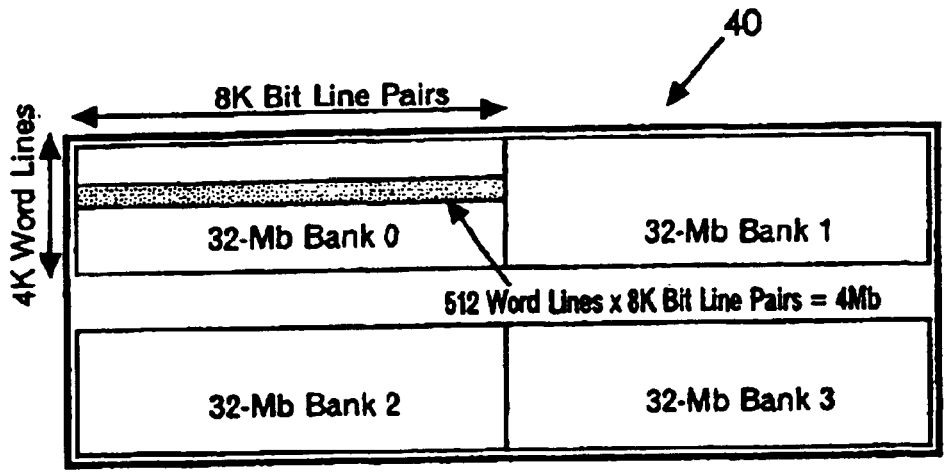
FIG. 1 depicts a schematic diagram of a conventional SDRAM.
Figure 2:
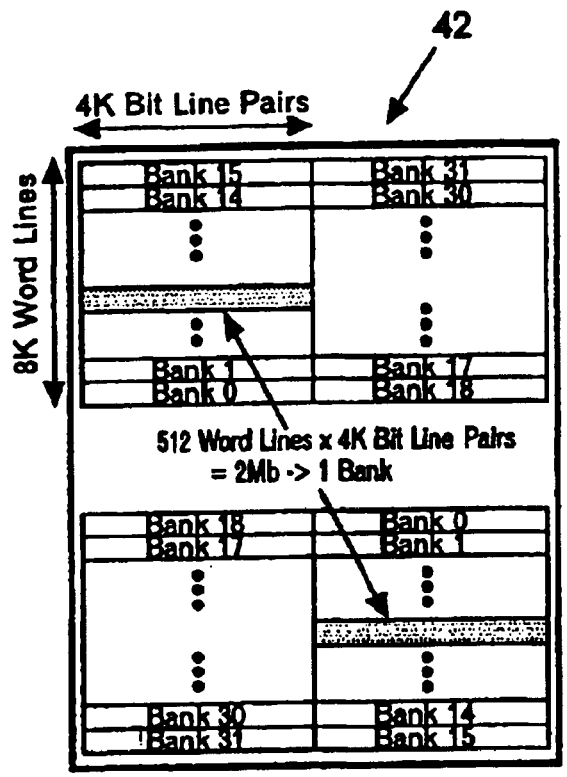
FIG. 2 depicts a schematic diagram of conventional Rambus.
Figure 3:
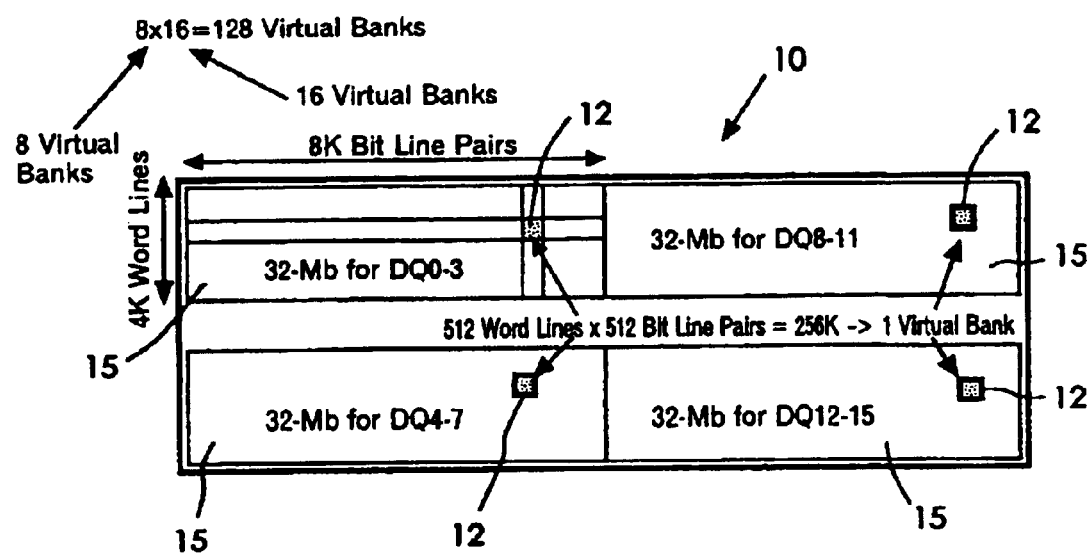
FIG. 3 depicts a schematic diagram of a DRAM of the present invention.

In FIG. 3, a DRAM 10 in accordance with the present invention is shown that is based on a memory that attempts seamless operations in random row access, without specifying page length since it does not use a page mode. It has a sufficient number of sense amplifiers (SA) for the burst length. Therefore, it is able to activate an extremely small block 12 and a large number of blocks, thus the performance of random row access may be improved by increasing the number of blocks 12 as much as possible in order to reduce bank conflicts without considering page hits and misses.

In order to avoid congestion of data lines, DRAM 10 is configured such that 16 I/O's are divided into four, wherein four I/O's are drawn from each 32 Mb divided array 15. Block 12 of DRAM 10 maybe composed, for example, of a matrix comprising 512 word lines and 512 bit line pairs, wherein data is stored in a cell located at each lattice. Accordingly, block 12 can store 256 Kb (=512×512) of data. Since array 15 is 32 Mb, the number of blocks contained in the array 15 is 128.

Figure 4:
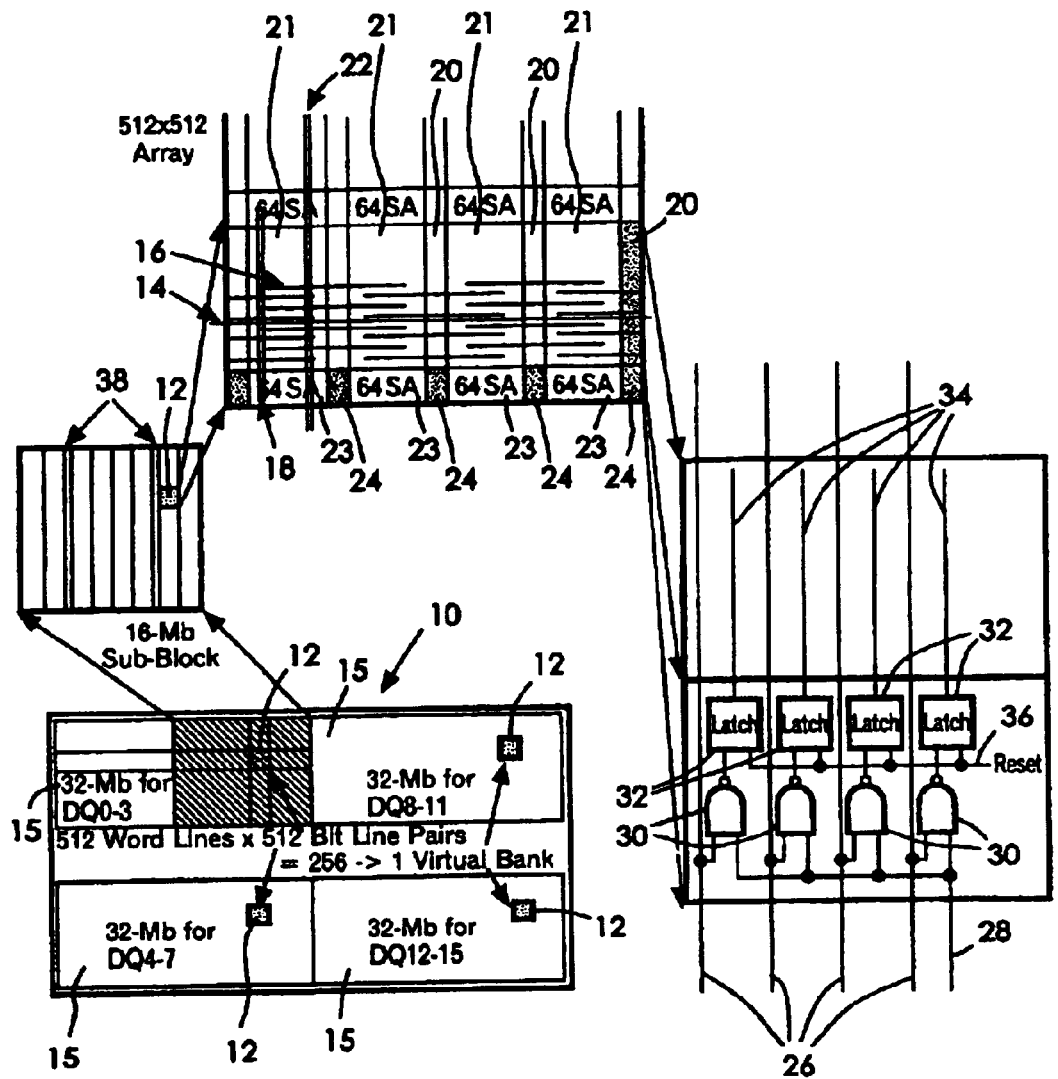
FIG. 4 depicts a structure of DRAM shown in FIG. 1 in detail using four detailed drawings.

FIG. 4 illustrates a structure of block 12 of 256 Kb. Block 12 is divided into four segments 21 by segment row decoder 20. 512 Bit line pairs 18 contained in block 12 are divided into four by segment row decoder 20. A sub-word line 16 comprised of eight polycides is selected from one main word line 14 that crosses 1024 bit line pairs 18, wherein one of these eight polycides is to be selected. There are 64 main word lines 14 in a block 12. Sub-word line 16 comprised of polycides are arranged across 256 bit line pairs 18 on both sides of segment row decoder 20. One of four sub-word lines 16 is selected in a segment row decoder 20.

On the far right side of FIG. 4, segment row decoder 20 and corner block (CB) 24 are shown. Corner block 24 comprises global Z-lines 26 to which a signal is sent to select a sub-word line 16 from four sub-word lines 16, segment select lines 28 to which an enable signal is sent to select a segment 21, four NAND circuits 30, and latch circuits 32. In addition, a reset line 36 is provided where a reset signal is input.

Segment row decoder 20 comprises four local Z-lines 34 connected to latch circuits 32. By activating one of four local Z-lines 34, sub-word lines 16 connected to that local Z-lines 34 are selected. There is provided a sense amplifier (SA) 23 in each segment 21.

A novel method for selecting sub-word lines 16, for accessing DRAM 10 is accomplished by selecting a main word line 14 which permits selection of eight sub-word lines 16. The procedure to select main word line 14 is described below.

From beneath the 32 Mb divided array 1S, a low level output signal of a pre-decoder is transmitted to one of four global Z-lines 26 through data line pairs 22. Namely, a signal for selecting sub-word line 16 is supplied to one of four global Z-lines 26. Data line pair 22 comprises 16 lines in one block. Segment select line 28 in corner block 24 is also supplied with an enable signal in the same manner as the output signal mentioned above. The signal for selecting sub-word line 16 and the enable signal are both a high pulse, which drives one of four NAND circuits 30 low. Furthermore, this pulse also serves as a signal for starting a series of timing chains.

In corner block 24, latch circuit 32 that receives a low signal from NAND circuit 30 drives local Z-line 34 connected therewith high. After being latched, the pulse of the enable signal becomes low. In this manner, latch circuit 32 operates with a low signal, whereby one of four local Z-lines 34 is selected. As a result, sub-word line 16 is activated which is connected to local Z-line 34 that is driven high in segment row decoder 20. In other words, one of sub-word lines 16 is selected from eight sub-word lines 16 that are selected by main word line 14.

In summary, main word line 14 selects a predetermined number of (i.e., eight) sub-word lines 16 among 512 sub-word lines 16, and then one of sub-word lines 16 is selected by a signal for selecting sub-word line 16 and an enable signal.

Likewise, main word line 14 is also latched in the same manner by main row decoder 38 shown in FIG. 4, whereby two polycide sub-word lines 16 are activated across 256 bit line pairs 18 in 256 Kb block 12. Namely, 512 bit line pairs 18 are activated by two sub-word lines 16.

There is also provided in corner block 24 a circuit for driving set nodes of the sense amplifier. Further provided in corner block 24 is a circuit for, in receipt of a drive signal from the drive circuit, generating a reset signal indicating that rewriting has been completed, which is then supplied to latch circuit 32. That is, the reset signal is the one that indicates completion of data rewriting. Using this signal for releasing the latch for local Z-line 34, sub-word line 16 can be restored. The reset signal is also used for restoring the set node of the sense amplifier after some delay of time.

In this manner, a series of operations from activation of sub-word line 16 to precharge together with the reading and the writing is sequentially processed by signals generated in corner block 24. Even if a next low access occurs for the other 256 Kb block 12 before this series of operations completes, the block 12 that was accessed first will not be affected by the change of global Z-lines 26 and continues its processing. Besides, processing of the next 256 Kb block 12 proceeds concurrently and the cycle will be able to be completed using its own signals. In this manner, block 12 can operate as if it were a bank without requiring global signals for a specific bank, thus it is called a virtual bank (VB). The virtual bank structure enables a large number of banks without incurring the overhead of corresponding bank control signals.

For a memory that attempts seamless row-to-row operations by accessing row addresses in a short-cycle pipeline with automatic precharge after prefetching full-burst length data or writing preloaded full-burst length data simultaneously, the invention can provide a substantially large number of banks without bank control and thus can improve the data rate.

The present invention abolishes a page mode, thus the concept of page hits and misses is unnecessary, and seamless operations are allowed even in a row-to-row access unless bank conflicts exist, so that the data rate is always maintained at a peak rate.

The following comparison assumes that the memory system bus is 64 bits in width (while Rambus is 16 bits in width) and 32 bytes of cache line is provided. One more important item in terms of bank conflicts is the ratio of the cycle time to the time required for the burst. For example, when processing a 32 byte cache line with 64 bit width, 4-bit burst is required. Since Rambus is 16 bits in width, 16-bit burst is required for the same size cache line.

First of all, when the cycle time is shorter than or equal to the burst time, any address can be accessed seamlessly in the row-to-row access even if there is no bank, thus the access probability is 100%. When the cycle time is twice the burst time, the currently accessed bank will be able to be used in the row access after next. Accordingly, if there are two banks, the other bank can be used in the next cycle, resulting in the access probability being 50%. The ratio of the cycle time to the burst time is 1 or 2 for memories that attempt seamless operations in a random row access, therefore, the success ratio of seamless operations is high with less bank conflicts occurring.

Conversely, conventional SDRAM DDR and Rambus have a cycle time that is four to five times longer. In this case, it is necessary to avoid bank conflicts during four to five cycles continuously in order to succeed in seamless access. Accordingly, it is inevitably impossible to obtain a high probability to avoid bank conflict. For example, SDRAM DDR has a cycle time to burst time ratio of four and utilizes four banks, so the first row access can use any bank, while the second can use three banks among four, the third can use two banks, and the fourth can use only one remaining bank because the first bank has not completed its precharge. Accordingly, the probability of all four cycles succeeding in seamless access without bank conflicts would be 9.375%(=(1×3/4×2/4×1/4)×100. In general, assuming that the number of banks to be B and the ratio of cycle time to burst time to be R, the success rate is given by the following equation.

[Equation 1] (1)
$$\frac{B-1}{B} \times \frac{B-2}{B} \times \cdots \times \frac{B-(R-1)}{B} \times 100$$

For Rambus, when one of the banks is used by the shared sense amplifier, its upper and lower banks are also used by the sense amplifier, thus a total of three banks can be used, and the success rate is given by the following equation, resulting in a low probability of seamless access operation regardless of the number of banks.

[Equation 2] (2)
$$\frac{B-3}{B} \times \frac{B-6}{B} \times \frac{B-9}{B} \times 100$$

The present invention provides a DRAM that attempts seamless operations in random row access where R is 1 or 2, wherein the success rate is 50% when only two banks are provided and it increases rapidly as the number of banks increases. The success rate reaches 94% when 16 banks are provided, while it reaches 99.3% for 128 banks, which is feasible for 128 Mb, which means that a row-to-row access for any address is almost always performed seamlessly. It is seen that for a shared sense amplifier such as Rambus, the success rate reaches 81% using 16 banks.

In addition, the virtual bank scheme of the present invention can achieve cost reduction by greatly reducing test time. With a bank architecture of conventional SDRAM or Rambus, an access to the other bank is made while maintaining activation of a first bank, a variety of tests are required combining these accesses. As the number of banks increases, the number of combinations becomes correspondingly large, thereby greatly increasing test cost. For this reason, the number of banks can not be increased indiscriminately. In fact, for Rambus having 16 or 32 banks, the number of banks that can be activated simultaneously is limited to four. This requires a reduction in page length, which in turn compromises the page hit rate. On the other hand, since the present invention needs no bank control and never accesses other banks while maintaining the sense amplifier active, complicated combination tests are unnecessary. For DRAM 10 of the present invention, normal random row accesses just have to be performed within a short period of time.

The present invention provides a method for processing low access operations from selection of a word line to precharge by using signals generated in the corner block, where performance is greatly improved through combining (1) a scheme used in a memory that attempts seamless operations in random row access for automatically performing precharge after prefetch or collective writing, and (2) a small ratio of cycle time to burst time, such as two, used in a memory that attempts seamless operations in random row access.

The present invention has been described in relation to the preferred embodiments, however, it should be construed that the present invention is not limited to those embodiments. For example, latch circuit 32 in corner block 24 may be operated with a high level signal instead of low signal. In this case, NAND circuit 30 is replaced with AND circuit.

In addition, the present invention will be improved, modified or changed by those skilled in the art without departing from the spirit and scope of the present invention.

As mentioned above, according to a DRAM and access method of the present invention, it becomes possible to overcome the idea of the background art where banks are provided in consideration of page misses due to the heavy use of page mode. Namely, performance of random row access, as such, is improved by abolishing the page mode and greatly reducing the cycle time through activation of blocks. In summary, the present invention makes good use of the activation of blocks and substantially allows an operation as if there were a large number of banks without conventional bank control, thereby achieving a high data rate of about 80%.

While the invention has been described in detail, the foregoing description is in all aspects illustrative and not restrictive. It is understood that numerous other modifications and variations can be devised without departing from the scope of the invention.

What is claimed is:

1. A DRAM comprising:
   a block composed of a plurality of segments storing data;
   main word lines for selecting a predetermined number of sub-word lines from a plurality of sub-word lines; and
   corner blocks for selecting one of said plurality of segments and one of said predetermined number of sub-word lines, wherein said corner block comprises:
   a plurality of global Z-lines to which a signal is sent for selecting the one of said predetermined number of sub-word lines;

segment select lines to which a signal is sent for selecting the segment;

a plurality of gating circuits to which the sub-word lines and segment select lines are connected;

a plurality of latch circuits operated by predetermined signals from said gating circuits.

2. The DRAM according to claim 1, further comprising local Z-lines connected to said latch circuits, said local Z-lines being activated by said latch circuits.

3. The DRAM according to claim 2, wherein the corner block comprises a circuit for generating a signal for driving set nodes of a sense amplifier.

4. The DRAM according to claim 3, wherein the corner block comprises a circuit for, in receipt of said signal for driving said set nodes, generating a reset signal indicating that rewriting of data has been completed.

5. A method for accessing a DRAM where one block is divided into multiple segments by a segment decoder and a desired sub-word line is selected from a plurality of sub-word lines in the block, the method comprising the steps of:

activating main word lines to select a predetermined number of sub-word lines from said plurality of sub-word lines;

activating a desired global Z-line among a plurality of global Z-lines contained in a corner block and segment select lines to activate a local Z-line corresponding to said desired global Z-line among said plurality of local Z-lines; and selecting a sub-word line corresponding to said activated local Z-line from said predetermined number of sub-word lines.

6. The method according to claim 5, wherein a sense amplifier is provided for each said block, further comprising the step of transmitting a signal from said corner block for driving set nodes of said sense amplifier.

7. The method according to claim 6, further comprising the step of resetting said activated local Z-line using a circuit contained in said corner block.

* * * * *